(12) United States Patent
Taya

(10) Patent No.: US 8,508,305 B2
(45) Date of Patent: Aug. 13, 2013

(54) OSCILLATION CIRCUIT

(75) Inventor: Takashi Taya, Tokyo (JP)

(73) Assignee: Lapis Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 13/275,554

(22) Filed: Oct. 18, 2011

(65) Prior Publication Data

US 2012/0098608 A1 Apr. 26, 2012

(30) Foreign Application Priority Data

Oct. 20, 2010 (JP) ................................ 2010-235450

(51) Int. Cl.
*H03B 5/12* (2006.01)

(52) U.S. Cl.
USPC ............. 331/117 FE; 331/117 R; 331/108 C (58) Field of Classification Search
USPC ................ 331/180 C, 108 D, 117 FE, 117 R, 331/167
See application file for complete search history.

(56) References Cited

U.S. PATENT DOCUMENTS

| | | | |
|---|---|---|---|
| 2005/0242897 A1* | 11/2005 | Lim et al. | 331/179 |
| 2008/0007359 A1* | 1/2008 | Forbes et al. | 331/135 |
| 2008/0278250 A1* | 11/2008 | Hung et al. | 331/117 R |
| 2010/0277250 A1* | 11/2010 | Aga et al. | 331/117 R |

FOREIGN PATENT DOCUMENTS

| | | |
|---|---|---|
| JP | 06-132728 A | 5/1994 |
| JP | 07-131243 A | 5/1995 |
| JP | 2007-110504 A | 4/2007 |

* cited by examiner

*Primary Examiner* — Ryan Johnson
*Assistant Examiner* — Christian L Rivera
(74) *Attorney, Agent, or Firm* — Kubotera & Associates, LLC (57) ABSTRACT

An oscillation circuit includes a resonance circuit and an amplifier circuit. The resonance circuit includes an inner capacitor to be disposed inside a semiconductor integrated circuit, and an outer capacitor and an outer inductor to be disposed outside the semiconductor integrated circuit. The amplifier circuit includes an input terminal and an output terminal both connected to the resonance circuit. Further, the resonance circuit includes a first closed circuit portion including the inner capacitor, the outer inductor, and a first wiring portion for connecting the inner capacitor and the outer inductor. The resonance circuit further includes a second closed circuit portion including the outer capacitor, the outer inductor, and a second wiring portion for connecting the outer capacitor and the outer inductor. The second closed circuit portion has a wiring resistance smaller than that of the first closed circuit portion.

13 Claims, 5 Drawing Sheets

OSCILLATION CIRCUIT

BACKGROUND OF THE INVENTION AND RELATED ART STATEMENT

The present invention relates to an oscillation circuit capable of oscillating a high frequency wave.

A conventional oscillation circuit disposed in a wireless device is formed of a transistor and a resonance circuit formed of an inductor and a capacitor. When a valuable capacitor is used as the capacitor, the conventional oscillation circuit constitutes a voltage controlled oscillator (VCO) capable of controlling a frequency. Further, the voltage controlled oscillator may be combined with a phase comparator, a loop filter, and a frequency divider to constitute a phase-locked loop (PLL) circuit to be used in a PLL frequency synthesizer.

In recent years, such a conventional oscillation circuit is formed as a part of a semiconductor integrated circuit. When the conventional oscillation circuit is formed as a part of the semiconductor integrated circuit, all components constituting the conventional oscillation circuit may be integrated into the semiconductor integrated circuit. Alternatively, a part of the components constituting the conventional oscillation circuit may be disposed outside the semiconductor integrated circuit (as a peripheral component).

For example, when an oscillation wave frequency becomes lower than few hundred mega Hertz (MHz), it is necessary to provide an inductor having an inductance of few tens nano Henry (nH). In this case, if the inductor is disposed in the semiconductor integrated circuit, it is necessary to provide a large area for installing the inductor, thereby increasing a size of the semiconductor integrated circuit. For this reason, when the oscillation wave frequency becomes lower than few hundred mega Hertz (MHz), the inductor is generally disposed outside the semiconductor integrated circuit. On the other hand, when the oscillation wave frequency becomes higher than one giga Hertz (GHz), it is necessary to provide an inductor having an inductance of about 5 nH. In this case, it is possible to dispose the inductor inside the semiconductor integrated circuit.

Patent Reference 1 has disclosed a conventional oscillation circuit, in which an inductor thereof is disposed as a peripheral component outside a semiconductor integrated circuit. Patent Reference 2 has disclosed a conventional oscillation circuit, in which a capacitor thereof is disposed as a peripheral component outside a semiconductor integrated circuit.

Further, Patent Reference 3 has disclosed a conventional oscillation circuit, in which a capacitor thereof is disposed inside a semiconductor integrated circuit and an inductor thereof is disposed as a peripheral component outside the semiconductor integrated circuit. The inductor is connected to the capacitor as the peripheral component in series.
Patent Reference 1: Japanese Patent Publication No. 2007-110504
Patent Reference 2: Japanese Patent Publication No. 07-131243
Patent Reference 3: Japanese Patent Publication No. 06-132728

In general, the wireless device includes various circuits having various functions such as a reception circuit, a transmission circuit, a phase synchronization circuit, a control circuit and the like, and the various circuits are disposed in the semiconductor integrated circuit. Especially, the reception circuit is provided for receiving a faint signal, so that a signal from the conventional oscillation circuit may cause interference with the reception circuit.

For example, in the conventional oscillation circuit, in which the transistor and the capacitor are disposed inside a semiconductor integrated circuit and only the inductor is disposed outside the semiconductor integrated circuit, when the oscillation wave frequency of 500 Mhz is realized with the inductor of 15 nH, the capacitor has a capacitance of 6.75 pF determined through the following calculation:

$$f = \frac{1}{2\pi\sqrt{LC}}$$

where f represents a resonance frequency, L represents the inductance, and C represents the capacitance.

When it is supposed that the conventional oscillation circuit has a voltage amplitude with an effective value of 1 V, the reactance of the inductor becomes $47.1\Omega(2\pi fL=47.1)$. Accordingly, a high frequency wave current flowing through the conventional oscillation circuit is determined to be 21.2 mA (1/47.1=0.0212), which is a large current corresponding to a power source current of the semiconductor integrated circuit.

When such a large high frequency wave current flows through the conventional oscillation circuit, a conductive material constituting a current path of the conventional oscillation circuit radiates an electromagnetic wave. Accordingly, a board potential of the semiconductor element tends to fluctuate, thereby deteriorating properties of other circuits in the semiconductor integrated circuit. For example, a property of the semiconductor integrated circuit such as reception sensitivity may be deteriorated.

To this end, it may be configured such that an oscillation amplitude may be decreased. When the oscillation amplitude is decreased, however, an extent of purity of the oscillation signal is deteriorated, thereby making it difficult to apply such a measure. Further, an interval between the conventional oscillation circuit and other circuits needs to be increased, or a shield member needs to be disposed between the conventional oscillation circuit and other circuits. However, such a measure increases an area as well as a cost of the semiconductor integrated circuit, thereby making the application thereof difficult.

In view of the problems described above, an object of the present invention is to provide an oscillation circuit capable of solving the problems of the conventional oscillation circuit. In the present invention, it is possible to prevent properties of other circuits disposed in a semiconductor integrated circuit from deteriorating when an oscillation circuit outputs an oscillation signal having an oscillation wave frequency of few hundred mega Hertz.

Further objects and advantages of the invention will be apparent from the following description of the invention.

SUMMARY OF THE INVENTION

In order to attain the objects described above, according to a first aspect of the present invention, an oscillation circuit is to be disposed in a semiconductor integrated circuit. The oscillation circuit includes a resonance circuit and an amplifier circuit. The resonance circuit includes an inner capacitor to be disposed inside the semiconductor integrated circuit and an outer capacitor and an outer inductor to be disposed outside the semiconductor integrated circuit. The amplifier circuit includes an input terminal and an output terminal both connected to the resonance circuit.

Further, the resonance circuit includes a first closed circuit portion including the inner capacitor, the outer inductor, and a first wiring portion for connecting the inner capacitor and the outer inductor. The resonance circuit further includes a second closed circuit portion including the outer capacitor, the outer inductor, and a second wiring portion for connecting the outer capacitor and the outer inductor. The second closed circuit portion has a wiring resistance smaller than that of the first closed circuit portion.

As described above, in the present invention, the resonance circuit includes the first closed circuit portion including the inner capacitor, the outer inductor, and the first wiring portion for connecting the inner capacitor and the outer inductor. The resonance circuit further includes the second closed circuit portion including the outer capacitor, the outer inductor, and the second wiring portion for connecting the outer capacitor and the outer inductor. The second closed circuit portion has the wiring resistance smaller than that of the first closed circuit portion. Accordingly, a high frequency wave current tends to flow outside the semiconductor integrated circuit. As a result, it is possible to reduce an influence of the high frequency wave current on other circuits of the semiconductor integrated circuit upon oscillation.

In present invention, even when the oscillation circuit outputs an oscillation signal having an oscillation frequency of few hundred mega Hertz, it is possible to minimize property deterioration of other circuits disposed inside the semiconductor integrated circuit.

DETAILED DESCRIPTION OF PREFERRED EMBODIMENTS

Hereunder, preferred embodiments of the present invention will be explained with reference to the accompanying drawings.

First Embodiment

Figure 1:
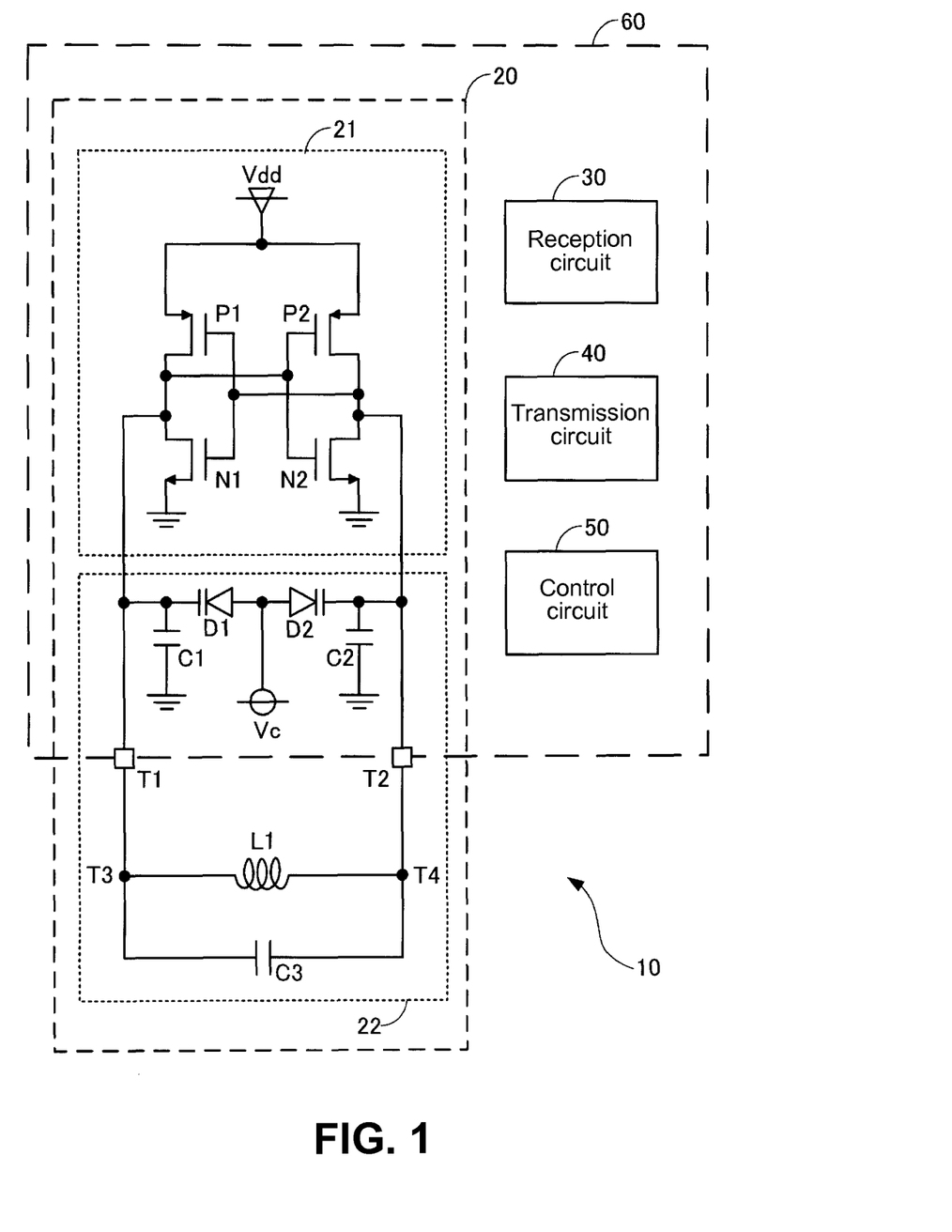
FIG. 1 is a block diagram showing a configuration of a wireless device having an oscillation circuit according to a first embodiment of the present invention.
Figure 2:
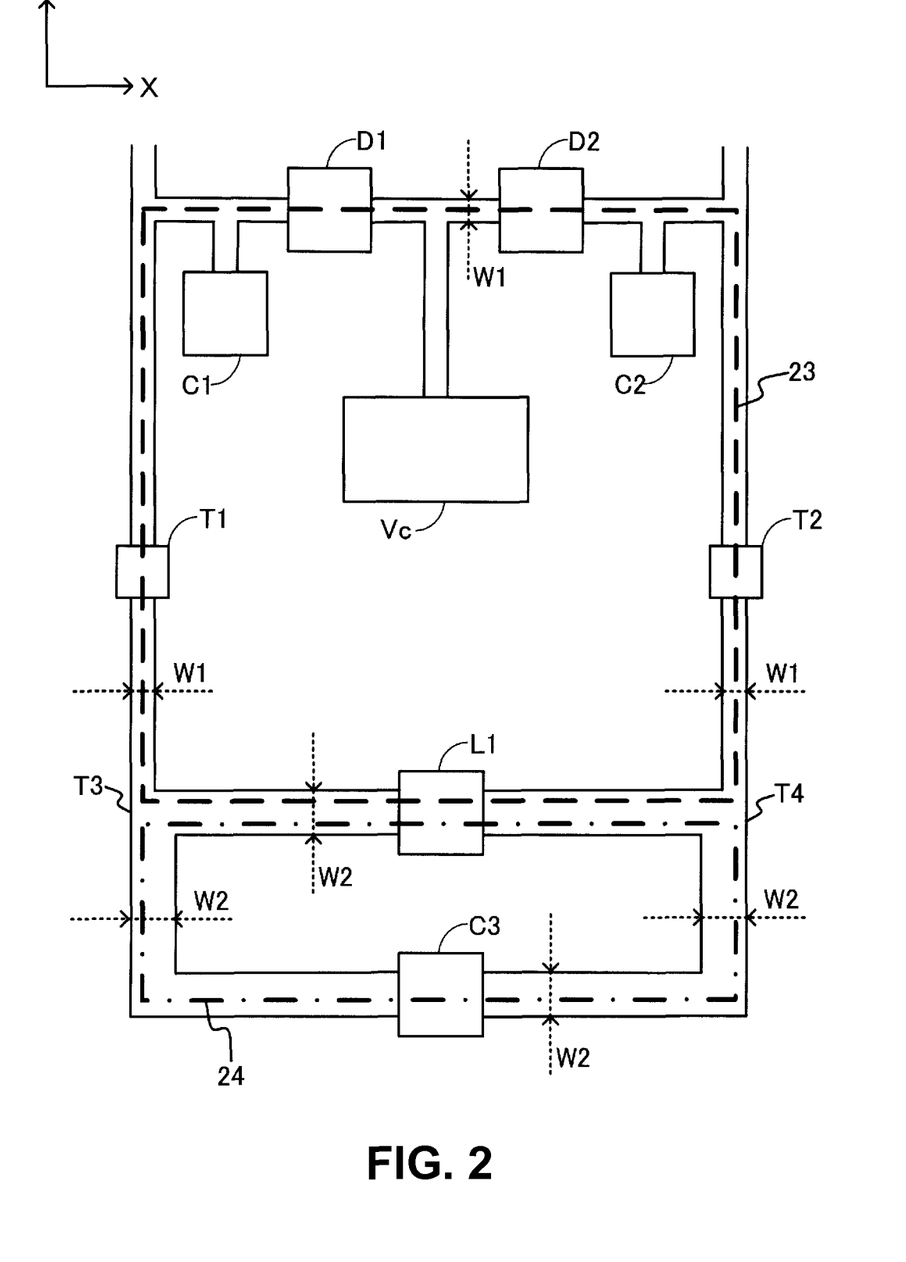
FIG. 2 is a block diagram showing a configuration of a resonance circuit of the oscillation circuit according to the first embodiment of the present invention.
Figure 3:
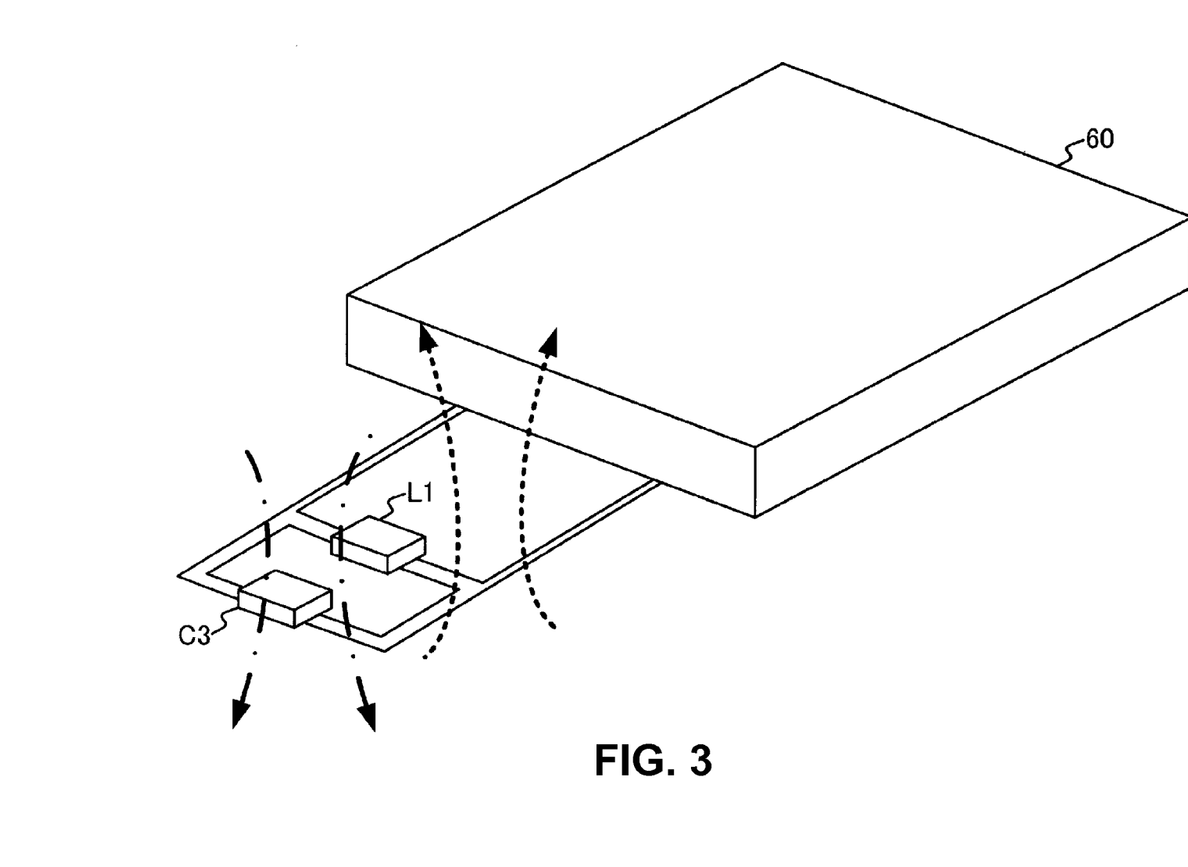
FIG. 3 is a schematic perspective view showing a semiconductor integrated circuit including the oscillation circuit according to the first embodiment of the present invention.

A first embodiment of the present invention will be explained with reference to FIGS. 1 to 3. FIG. 1 is a block diagram showing a configuration of a wireless device 10 having an oscillation circuit 20 according to the first embodiment of the present invention. FIG. 2 is a block diagram showing a configuration of a resonance circuit 22 of the oscillation circuit 20 according to the first embodiment of the present invention. FIG. 3 is a schematic perspective view showing a semiconductor integrated circuit 60 including the oscillation circuit 20 according to the first embodiment of the present invention.

As shown in FIG. 1, the wireless device 10 includes the oscillation circuit 20; a reception circuit 30; a transmission circuit 40; and a control circuit 50. In the wireless device 10, a part of the oscillation circuit 20, the reception circuit 30, the transmission circuit 40 and the control circuit 50 are disposed inside the semiconductor integrated circuit 60.

In the embodiment, the reception circuit 30 has a function of receiving data supplied from other wireless device to the semiconductor integrated circuit 60 so that the reception circuit 30 performs a specific process on the data. The transmission circuit 40 has a function of generating data to be transmitted from the semiconductor integrated circuit 60 to other wireless device so that the transmission circuit 40 transmits the data. The control circuit 50 has a function of supplying a control signal to the oscillation circuit 20, the reception circuit 30, and the transmission circuit 40 so that the control circuit 50 controls the oscillation circuit 20, the reception circuit 30, and the transmission circuit 40 to perform a specific operation. It is noted that the wireless device 10 may further include a memory unit for accumulating data in addition to the circuits described above, and is not limited to the configuration described above.

In the embodiment, the oscillation circuit 20 includes an amplifier circuit 21 and the resonance circuit 22 connected to an input terminal and an output terminal of the amplifier circuit 21. The amplifier circuit 21 is formed of p-channel type MOS (Metal Oxide Semiconductor) transistors P1 and P2 and n-channel type MOS (Metal Oxide Semiconductor) transistors N1 and N2 disposed inside the semiconductor integrated circuit 60.

More specifically, in the amplifier circuit 21, source terminals of the MOS transistors P1 and P2 are connected to a power source voltage Vdd. A drain terminal of the p-channel type MOS transistor P1 is connected to a drain terminal of the n-channel type MOS transistor N1, and a drain terminal of the p-channel type MOS transistor P2 is connected to a drain terminal of the n-channel type MOS transistor N2. The drain terminal of the p-channel type MOS transistor P1 is connected to gate terminals of the p-channel type MOS transistor P2 and the n-channel type MOS transistor N2, and the drain terminal of the p-channel type MOS transistor P2 is connected to gate terminals of the p-channel type MOS transistor P1 and the n-channel type MOS transistor N1.

Further, the gate terminal of the p-channel type MOS transistor P1 is connected to the gate terminal of the n-channel type MOS transistor N1 and the drain terminals of the p-channel type MOS transistor P2 and the n-channel type MOS transistor N2, and the gate terminal of the p-channel type MOS transistor P2 is connected to the gate terminal of the n-channel type MOS transistor N2 and the drain terminals of the p-channel type MOS transistor P1 and the n-channel type MOS transistor N1. Source terminals of the n-channel type MOS transistor N1 and the n-channel type MOS transistor N2 are connected to a ground potential.

In the embodiment, the resonance circuit 22 is formed of inner capacitors C1 and C2, variable capacitance diodes D1 and D2, an outer inductor L1, and an outer capacitor C3. The inner capacitors C1 and C2 and the variable capacitance diodes D1 and D2 are disposed inside the semiconductor integrated circuit 60. The outer inductor L1 and the outer capacitor C3 are disposed outside the semiconductor integrated circuit 60.

More specifically, in the resonance circuit 22, an anode of the variable capacitance diode D1 is connected to an anode of the variable capacitance diode D2, and the anodes of the variable capacitance diode D1 and the variable capacitance diode D2 are connected to a frequency control voltage Vc. A cathode of the variable capacitance diode D1 is connected to the inner capacitor C1 and an outer connection terminal T1 of the semiconductor integrated circuit 60, and a cathode of the variable capacitance diode D2 is connected to the inner capacitor C2 and an outer connection terminal T2 of the semiconductor integrated circuit 60. One end terminals of the inner capacitor C1 and the inner capacitor C2 are connected to the ground potential.

Further, the inner capacitor C1 and the variable capacitance diode D1 are connected to the drain terminals of the p-channel type MOS transistor P1 and the n-channel type MOS transistor N1 of the amplifier circuit 21, and the inner capacitor C2 and the variable capacitance diode D2 are connected to the drain terminals of the p-channel type MOS transistor P2 and the n-channel type MOS transistor N2 of the amplifier circuit 21. Outside the semiconductor integrated circuit 60, the one end terminals of the outer inductor L1 and the outer capacitor C3 are connected to the outer connection terminal T1 of the semiconductor integrated circuit 60 through a connecting point T3, and the other end terminals of the outer inductor L1 and the outer capacitor C3 are connected to the outer connection terminal T2 of the semiconductor integrated circuit 60 through a connecting point T4.

A configuration of the resonance circuit 22 will be explained in more detail with reference to FIG. 2. It is noted that in FIG. 2, wiring portions extend from both end portions of the outer inductor L1 in an X direction, and wiring portions extend from the outer connection terminal T1 and the outer connection terminal T2 in a Y direction.

As shown in FIG. 2, the resonance circuit 22 includes a first closed circuit portion 23 (represented with a hidden line) and a second closed circuit portion 24 (represented with a projected line). The first closed circuit portion 23 is formed through a connection between the variable capacitance diode D1, the variable capacitance diode D2, and the outer inductor L1 through the outer connection terminal T1 and the outer connection terminal T2. The second closed circuit portion 24 is formed through a connection between the outer inductor L1 and the outer capacitor C3.

In the embodiment, the wiring portion of the first closed circuit portion 23 is configured to have a wiring length greater than a wiring length of the wiring portion of the second closed circuit portion 24. Further, an area surrounded with the first closed circuit portion 23 is configured to be greater than area surrounded with the second closed circuit portion 24. It is noted that the wiring portion of the first closed circuit portion 23 may be formed of a material similar or identical to that of the wiring portion of the second closed circuit portion 24.

In the embodiment, the wiring portion of the first closed circuit portion 23 has a width W1 smaller than a width W2 of the wiring portion of the second closed circuit portion 24. More specifically, the wiring portion of the first closed circuit portion 23 has a wiring section from the connecting point T3 to the connecting point T4 through the outer connection terminal T1, the variable capacitance diode D1, the variable capacitance diode D2, and the outer connection terminal T2, and the wiring section has the width W1 smaller than the width W2 of the wiring portion of the second closed circuit portion 24. It is noted that the wiring portion of the first closed circuit portion 23 may have a thickness similar or identical to that of the wiring portion of the second closed circuit portion 24. Accordingly, the wiring portion of the first closed circuit portion 23 has a cross sectional area smaller than that of the wiring portion of the second closed circuit portion 24.

In the embodiment, the wiring section with the width W1 extends in the Y direction, and is connected to the wiring portion with the width W2 extending in the Y direction at the connecting point T3 and the connecting point T4 such that an outer edge of the wiring section with the width W1 matches to that of the wiring portion with the width W2.

In the embodiment, it is not necessary to configure the wiring portion of the second closed circuit portion 24 to have the width greater than that of the wiring portion of the first closed circuit portion 23 all the way. For example, the wiring portion of the second closed circuit portion 24 may have a large width only in a section thereof extending in the Y direction.

Further, the wiring section with the width W1 extending in the Y direction may be connected to the wiring portion with the width W2 extending in the Y direction at the connecting point T3 and the connecting point T4 such that an inner edge of the wiring section with the width W1 matches to that of the wiring portion with the width W2. Further, the wiring section with the width W1 may be connected to the wiring portion with the width W2 at the connecting point T3 and the connecting point T4 such that a middle portion of the wiring section with the width W1 matches to that of the wiring portion with the width W2.

In the embodiment, the oscillation circuit 20 oscillates at a frequency determined by a combined capacitance of the inner capacitor C1, the inner capacitor C2, the outer capacitor C3, the variable capacitance diode D1, and the variable capacitance diode D2, and an inductance of the outer inductor L1. It is noted that it is possible to change the oscillation frequency of the oscillation circuit 20 through adjusting the frequency control voltage Vc applied to the variable capacitance diode D1 and the variable capacitance diode D2.

In the embodiment, for example, when the outer inductor L1 has the inductance of 15 nH, the inner capacitor C1, the inner capacitor C2, the variable capacitance diode D1, and the variable capacitance diode D2 have the combined capacitance of 1.75 pF, and the outer capacitor C3 has the capacitance of 5 pF, the oscillation circuit 20 has the oscillation frequency of 500 Mhz. In this case, the outer inductor L1 has the reactance of 47.1Ω, so that the high frequency wave current of 21.2 mA flows through the outer inductor L1.

In the embodiment, the high frequency wave current flowing through the outer inductor L1 is a sum of a high frequency wave current flowing through the semiconductor integrated circuit 60 (that is, through the first closed circuit portion 23) and a high frequency wave current flowing through the outer capacitor C3 (that is, through the second closed circuit portion 24). More specifically, the high frequency wave current of 21.2 mA flowing through the outer inductor L1 is the sum of the high frequency wave current of 5.5 mA flowing through the first closed circuit portion 23 and the high frequency wave current of 15.7 mA flowing through the second closed circuit portion 24.

As described above, in the embodiment, the capacitors for determining the oscillation frequency are divided and disposed outside and inside the semiconductor integrated circuit 60. Further, the outer capacitor C3 disposed outside the semiconductor integrated circuit 60 has the capacitance greater than the combined capacitance of the capacitors disposed inside the semiconductor integrated circuit 60. Accordingly, it is possible to reduce the current amount flowing thorough inside the semiconductor integrated circuit 60. As a result, it is possible to minimize the influence on the reception circuit 30, the transmission circuit 40, and the control circuit 50 disposed inside the semiconductor integrated circuit 60 due to the high frequency wave current flowing through the oscillation circuit 20.

Further, in the embodiment, the wiring portion of the first closed circuit portion 23 has the wiring length greater than the wiring length of the wiring portion of the second closed circuit portion 24. Further, the wiring portion of the first closed circuit portion 23 has the cross sectional area smaller than the cross sectional area of the wiring portion of the second closed circuit portion 24, and a same material may be used for both wiring portions. As a result, the second closed circuit portion 24 has a wiring resistance smaller than that of the first closed circuit portion 23. Accordingly, the high frequency wave current tends to flow through the second closed circuit portion 24 more easily, thereby making it possible to effectively reduce the current amount flowing inside the semiconductor integrated circuit 60. Therefore, it is possible to minimize the influence on the reception circuit 30, the transmission circuit 40, and the control circuit 50 disposed inside the semiconductor integrated circuit 60.

In the embodiment, even when it is necessary to dispose the capacitors inside the semiconductor integrated circuit 60 having the combined capacitance equal to or greater than the capacitance of the outer capacitor C3, it is configured such that the wiring portion of the first closed circuit portion 23 has the width smaller than that of the wiring portion of the second closed circuit portion 24. Accordingly, it is possible to effectively reduce the current amount flowing inside the semiconductor integrated circuit 60. Therefore, it is possible to minimize the influence on the reception circuit 30, the transmission circuit 40, and the control circuit 50 disposed inside the semiconductor integrated circuit 60.

In the embodiment, as far as the second closed circuit portion 24 has the wiring resistance smaller than that of the first closed circuit portion 23, the configuration of the oscillation circuit 20 is not limited to the one described above. For example, the wiring portion of the first closed circuit portion 23 may be formed of a material having conductivity lower than that of a material of the wiring portion of the second closed circuit portion 24. Further, the wiring portion of the first closed circuit portion 23 may have a thickness smaller than that of the wiring portion of the second closed circuit portion 24, so that the second closed circuit portion 24 has the wiring resistance smaller than that of the first closed circuit portion 23.

In the embodiment, the first closed circuit portion 23 has an area greater than an area of the second closed circuit portion 24. In general, strength of a high frequency magnetic field is determined by a product of an area surrounded with a current path and a current value. Accordingly, when the second closed circuit portion 24 has a larger area than the first closed circuit portion 23, even if a large current flows through the second closed circuit portion 24, it is still possible to reduce the strength of the high frequency magnetic field in the second closed circuit portion 24.

In the embodiment, the inner capacitor C1, the inner capacitor C2, the variable capacitance diode D1, and the variable capacitance diode D2 are arranged away from the outer inductor L1 in the Y direction, and the outer capacitor C3 is arranged on an opposite side of the outer inductor L1 in the Y direction outside the first closed circuit portion 23. Further, the first closed circuit portion 23 extends from the connecting points T3 and T4 in the Y direction toward an opposite direction to the second closed circuit portion 24. Accordingly, at any given time, the high frequency wave current flows through the first closed circuit portion 23 in a direction opposite to that of the high frequency wave current flowing through the second closed circuit portion 24. In other words, the high frequency wave current flowing through the first closed circuit portion 23 has an inverted phase with respect to a phase of the high frequency wave current flowing through the second closed circuit portion 24.

Accordingly, as shown in FIG. 3, at a specific time, the high frequency magnetic field in the first closed circuit portion 23 flows a direction (represented with a hidden line) opposite to that (represented with a projected line) of the high frequency magnetic field in the second closed circuit portion 24. As a result, the high frequency magnetic field generated with the high frequency wave current flowing in the first closed circuit portion 23 compensates the high frequency magnetic field generated with the high frequency wave current flowing in the second closed circuit portion 24. Therefore, it is possible to minimize the influence on the reception circuit 30, the transmission circuit 40, and the control circuit 50 disposed inside the semiconductor integrated circuit 60 due to the high frequency magnetic field generated in the first closed circuit portion 23.

As described above, the strength of the high frequency magnetic field is determined by a product of an area surrounded with a current path and a current value. Accordingly, it is preferred to configure such that the wiring portions of the first closed circuit portion 23 and the second closed circuit portion 24 have the specific wiring lengths and the widths. Further, the inner capacitor C1, the inner capacitor C2, the variable capacitance diode D1, the variable capacitance diode D2, and the outer capacitor C3 have the specific levels of the capacitance. As a result, the product of the area surrounded with the first closed circuit portion 23 and the current value flowing through the first closed circuit portion 23 becomes substantially equal to the product of the area surrounded with the second closed circuit portion 24 and the current value flowing through the second closed circuit portion 24.

In the embodiment, as far as the high frequency wave current flowing through the first closed circuit portion 23 has the inverted phase with respect to the phase of the high frequency wave current flowing through the second closed circuit portion 24, the outer inductor L1 and the outer capacitor C3 are not necessarily arranged in the way described above. For example, the outer capacitor C3 may be arranged in the area surrounded with the first closed circuit portion 23.

In the embodiment, the amplifier circuit 21 is formed of the p-channel type MOS transistor P1, the p-channel type MOS transistor P2, the n-channel type MOS transistor N1 and the n-channel type MOS transistor N2. The present invention is not limited thereto, and the amplifier circuit 21 may be formed of only p-channel type MOS transistors or n-channel type MOS transistors. Further, the outer inductor L1 may have a center tap, or may be formed of two inductors connected in series.

In the embodiment, the oscillation circuit 20 is not limited to the configuration described above, and may be formed of the Colpitts circuit, the Hartley circuit, or the Clapp circuit. In any cases, it is necessary to dispose at least an inductor and a capacitor outside the semiconductor integrated circuit 60. Instead of the outer inductor L1, a quartz crystal unit may be disposed to constitute a quartz crystal oscillation circuit.

As described above, in the embodiment, the oscillation circuit 20 includes the first closed circuit portion 23 formed of the inner capacitor C1 and the inner capacitor C2 disposed inside the semiconductor integrated circuit 60; the outer inductor L1 disposed outside the semiconductor integrated circuit 60; and the wiring portion connecting the inner capacitor C1, the inner capacitor C2, and the outer inductor L1.

Further, the oscillation circuit 20 includes the second closed circuit portion 24 formed of the outer capacitor C3 disposed outside the semiconductor integrated circuit 60; the outer inductor L1 disposed outside the semiconductor integrated circuit 60; and the wiring portion connecting the outer capacitor C3 and the outer inductor L1. It is configured such that the second closed circuit portion 24 has the wiring resistance smaller than that of the first closed circuit portion 23. Accordingly, the high frequency wave current tends to flow outside the semiconductor integrated circuit 60 easily. As a result, it is possible to minimize the influence on the other circuits inside the semiconductor integrated circuit 60 due to the high frequency wave current flowing upon oscillation.

In the embodiment, even when the oscillation circuit 20 outputs an oscillation signal having an oscillation frequency of few hundred mega Hertz, it is possible to minimize property deterioration of the other circuits disposed inside the semiconductor integrated circuit 60.

Second Embodiment

Figure 4:
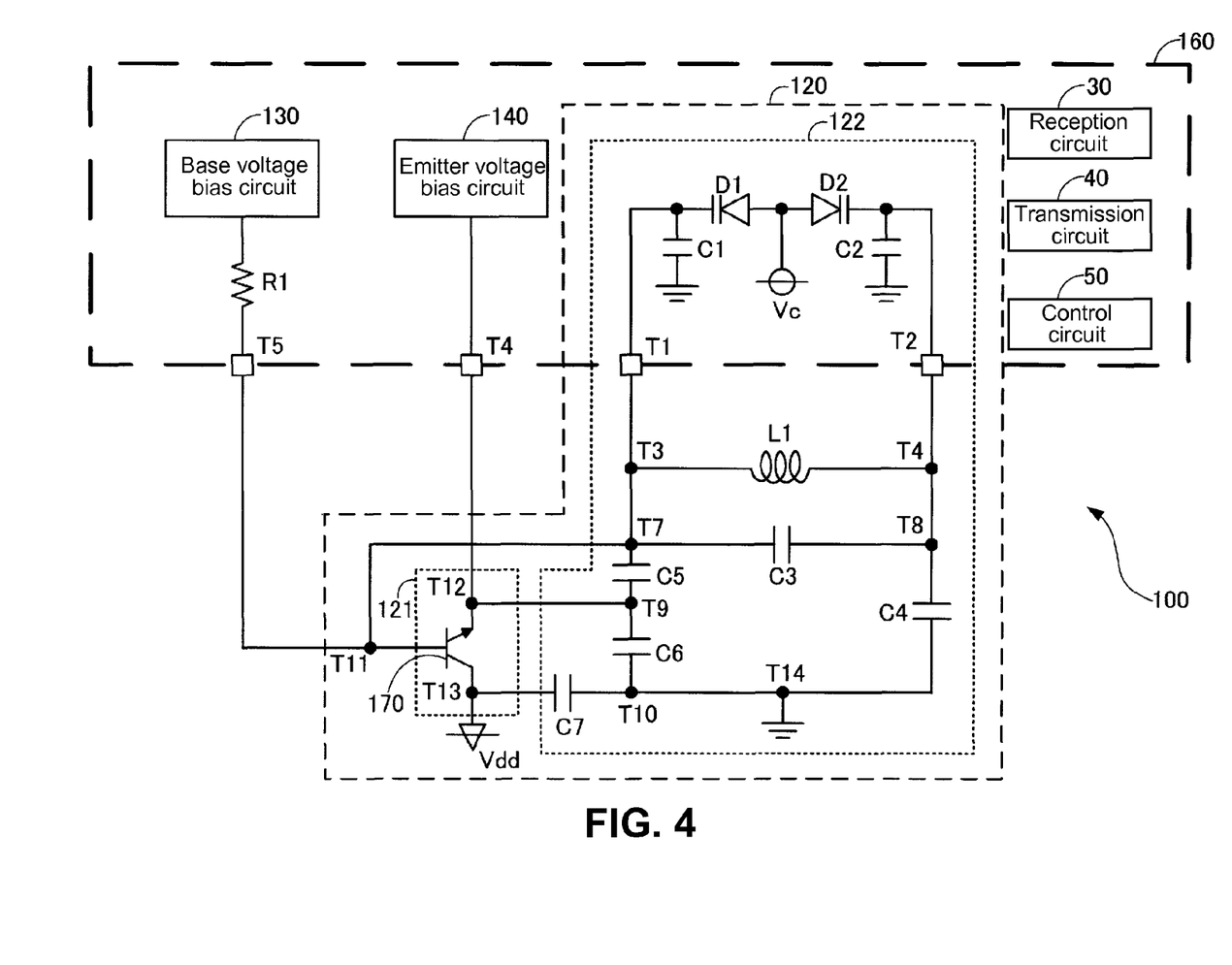
FIG. 4 is a block diagram showing a configuration of a wireless device having an oscillation circuit according to a second embodiment of the present invention.
Figure 5:
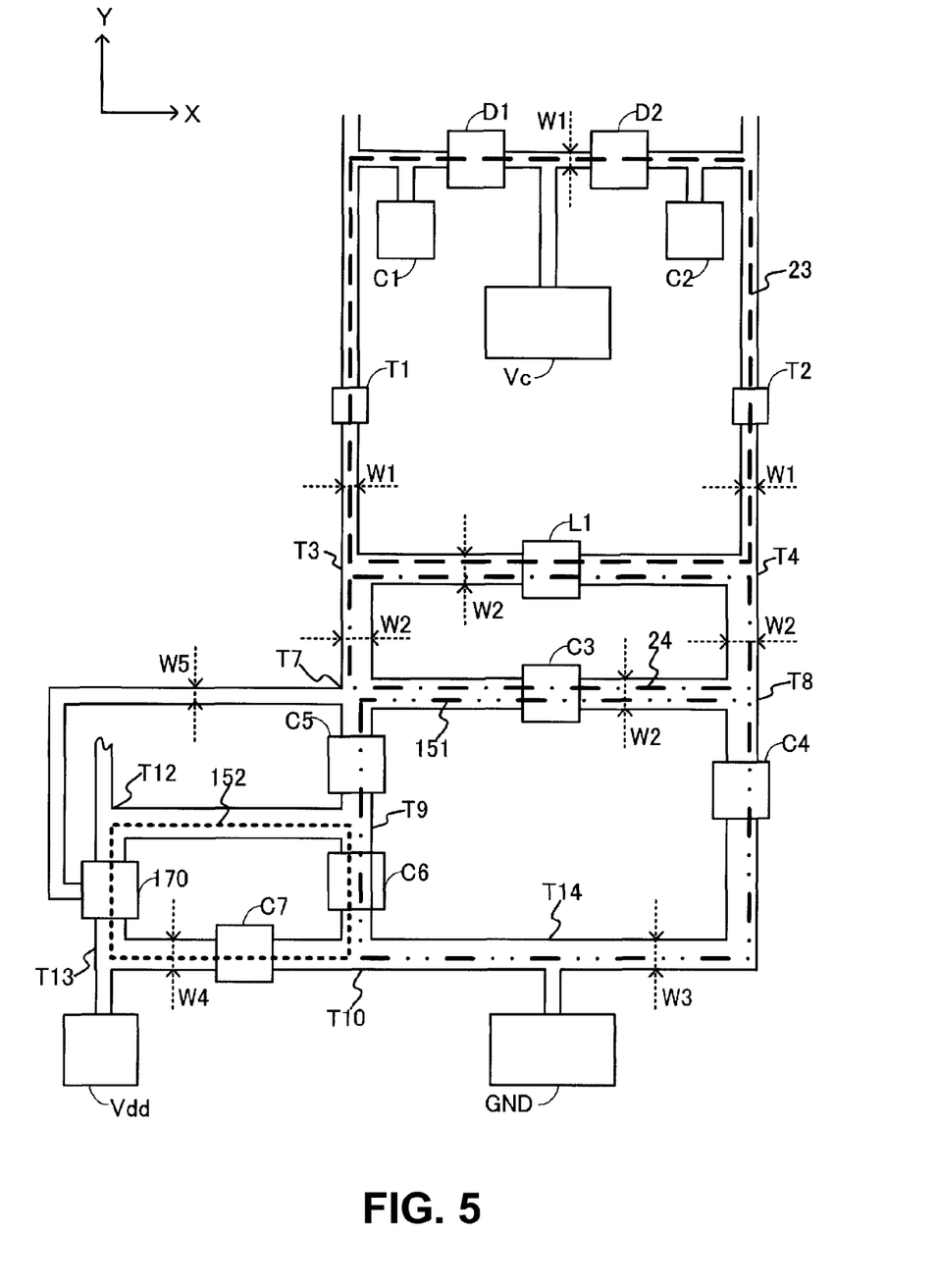
FIG. 5 is a block diagram showing a configuration of a resonance circuit of the oscillation circuit according to the second embodiment of the present invention.

A second embodiment of the present invention will be explained next with reference to FIGS. 4 and 5. FIG. 4 is a block diagram showing a configuration of a wireless device 100 having an oscillation circuit 120 according to the second embodiment of the present invention. FIG. 5 is a block diagram showing a configuration of a resonance circuit 122 of the oscillation circuit 120 according to the second embodiment of the present invention. Components in the second embodiment similar to those of the wireless device 10 in the first embodiment are designated with the same reference numerals, and explanations thereof are omitted.

In the first embodiment, the amplifier circuit 21 of the oscillation circuit 20 is disposed inside the semiconductor integrated circuit 60. In the second embodiment, an amplifier circuit 121 of the oscillation circuit 120 is disposed outside a semiconductor integrated circuit 160.

As shown in FIG. 4, the wireless device 100 includes the oscillation circuit 120; the reception circuit 30; the transmission circuit 40; the control circuit 50, a base voltage bias circuit 130; and an emitter voltage bias circuit 140 (a current source). In the wireless device 100, a part of the oscillation circuit 120, the reception circuit 30, the transmission circuit 40, the control circuit 50, the base voltage bias circuit 130, and the emitter voltage bias circuit 140 are disposed inside the semiconductor integrated circuit 160.

In the embodiment, the oscillation circuit 120 includes the amplifier circuit 121 and the resonance circuit 122. The amplifier circuit 121 is formed of a bi-polar transistor 170 of an NPN type disposed outside the semiconductor integrated circuit 160. A base terminal of the bi-polar transistor 170 is connected to the base voltage bias circuit 130 disposed inside the semiconductor integrated circuit 160 through an outer connection terminal T5 and a resistor R1. An emitter terminal of the bi-polar transistor 170 is connected to the emitter voltage bias circuit 140 disposed inside the semiconductor integrated circuit 160 through an outer connection terminal T6. A collector terminal of the bi-polar transistor 170 is connected to the power source voltage Vdd.

In the embodiment, the resonance circuit 122 is formed of inner capacitors C1 and C2, variable capacitance diodes D1 and D2, an outer inductor L1, and outer capacitors C3 to C7. The inner capacitors C1 and C2 and the variable capacitance diodes D1 and D2 are disposed inside the semiconductor integrated circuit 160. The outer inductor L1 and the outer capacitors C3 to C7 are disposed outside the semiconductor integrated circuit 160.

More specifically, in the resonance circuit 122, the outer capacitor C3 and the outer inductor L1 are connected to each other in parallel outside the semiconductor integrated circuit 160. Outside the semiconductor integrated circuit 160, one end terminals of the outer inductor L1 and the outer capacitor C3 are connected to an outer connection terminal T1 of the semiconductor integrated circuit 160 through a connecting point T3, and the other end terminals of the outer inductor L1 and the outer capacitor C3 are connected to an outer connection terminal T2 of the semiconductor integrated circuit 160 through a connecting point T4.

Further, one end terminal of the outer capacitor C3 is connected to the outer capacitor C5 through a connecting point T7, and the other end terminal of the outer capacitor C3 is connected to the outer capacitor C4 through a connecting point T8. The outer capacitor C5 is connected to the outer capacitor C6 through a connecting point T9, and the outer capacitor C6 is connected to the outer capacitor C6 through a connecting point T10. Further, the outer capacitor C3 and the outer capacitor C5 are connected to the base terminal of the bi-polar transistor 170 through the connecting points T7 and T11; the outer capacitor C5 and the outer capacitor C6 are connected to the emitter terminal of the bi-polar transistor 170 through the connecting points T9 and T12; and the outer capacitor C7 is connected to the collector terminal of the bi-polar transistor 170 through a connecting point T13. The outer capacitor C4 is connected to the ground potential through a connecting point T14, and the outer capacitor C6 and the outer capacitor C7 are connected to the ground potential through the connecting points T10 and T14.

In the embodiment, the outer capacitor C4 and the outer capacitor C7 are provided for reducing an impedance of a power source having the power source voltage Vdd. An inner configuration of the semiconductor integrated circuit 160 is similar to that in the first embodiment, and an explanation thereof is omitted.

A configuration of the resonance circuit 122 will be explained in more detail with reference to FIG. 5. It is noted that in FIG. 5, wiring portions extend from both end portions of the outer inductor L1 in an X direction, and wiring portions extend from the outer connection terminal T1 and the outer connection terminal T2 in a Y direction.

As shown in FIG. 5, similar to the first embodiment, the resonance circuit 122 includes the first closed circuit portion 23 and the second closed circuit portion 24. Further, the resonance circuit 122 includes a third closed circuit portion 151 (represented with a projected line) and a fourth closed circuit portion 152 (represented with a hidden line). The third closed circuit portion 151 is formed through a connection between the outer capacitor C3, the outer capacitor C4, the outer capacitor C5, and the outer capacitor C6. The fourth closed circuit portion 152 is formed through a connection between the outer capacitor C6, the outer capacitor C7, and the bi-polar transistor 170.

In the embodiment, the wiring portion of the first closed circuit portion 23 is configured to have a wiring length greater than wiring lengths of the wiring portions of the second closed circuit portion 24, the third closed circuit portion 151, and the fourth closed circuit portion 152. Further, the wiring portion of the second closed circuit portion 24 has the width W2 equal to a width W3 of the wiring portions of the third closed circuit portion 151 and the fourth closed circuit portion 152 and a width W4 of the fourth closed circuit portion 152. Further, the bi-polar transistor 170 has a wiring section from the base terminal thereof to the connecting point T7, and the wiring section has a width W5 equal to the width W1 of the wiring portion of the first closed circuit portion 23.

It is noted that the wiring portion of the first closed circuit portion 23 may have a thickness similar or identical to that of the wiring portions of the second closed circuit portion 24, the third closed circuit portion 151, and the fourth closed circuit portion 152. Accordingly, the wiring portion of the first closed circuit portion 23 has a cross sectional area smaller than those of the wiring portions of the second closed circuit portion 24, the third closed circuit portion 151, and the fourth closed circuit portion 152. It is further noted that the wiring portion of the first closed circuit portion 23 may be formed of a material similar or identical to that of the wiring portions of the second closed circuit portion 24, the third closed circuit portion 151, and the fourth closed circuit portion 152.

In the embodiment, the oscillation circuit 120 oscillates at a frequency determined by a combined capacitance of the inner capacitor C1, the inner capacitor C2, the outer capacitor C3, the outer capacitor C4, the outer capacitor C5, the outer capacitor C6, the outer capacitor C7, the variable capacitance diode D1, and the variable capacitance diode D2, and an inductance of the outer inductor L1. It is noted that it is possible to change the oscillation frequency of the oscillation circuit 120 through adjusting the frequency control voltage Vc applied to the variable capacitance diode D1 and the variable capacitance diode D2.

As described above, in the embodiment, the capacitors for determining the oscillation frequency are divided and disposed outside and inside the semiconductor integrated circuit 160. Further, the outer capacitor C3, the outer capacitor C4, the outer capacitor C5, the outer capacitor C6, and the outer capacitor C7 disposed outside the semiconductor integrated circuit 160 have the combined capacitance greater than the combined capacitance of the capacitors disposed inside the semiconductor integrated circuit 160. Accordingly, it is possible to reduce the current amount flowing thorough inside the semiconductor integrated circuit 160. As a result, it is possible to minimize the influence on the reception circuit 30, the transmission circuit 40, and the control circuit 50 disposed inside the semiconductor integrated circuit 160 due to the high frequency wave current flowing through the oscillation circuit 120.

Further, in the embodiment, the wiring portion of the first closed circuit portion 23 has the wiring length greater than the wiring length of the wiring portion of the second closed circuit portion 24, the third closed circuit portion 151, or the fourth closed circuit portion 152. Further, the wiring portion of the first closed circuit portion 23 has the cross sectional area smaller than the cross sectional area of the wiring portion of the second closed circuit portion 24, the third closed circuit portion 151, or the fourth closed circuit portion 152, and a same material may be used for both wiring portions. As a result, the second closed circuit portion 24 has a wiring resistance smaller than that of the first closed circuit portion 23, the third closed circuit portion 151, or the fourth closed circuit portion 152. Accordingly, the high frequency wave current tends to flow through the second closed circuit portion 24, the third closed circuit portion 151, and the fourth closed circuit portion 152 more easily, thereby making it possible to effectively reduce the current amount flowing inside the semiconductor integrated circuit 160. Therefore, it is possible to minimize the influence on the reception circuit 30, the transmission circuit 40, and the control circuit 50 disposed inside the semiconductor integrated circuit 160.

In the embodiment, the amplifier circuit 121 is disposed outside the semiconductor integrated circuit 160. Accordingly, the current flows from the bi-polar transistor 170 of the amplifier circuit 121 to the ground potential without passing through the semiconductor integrated circuit 160. Therefore, it is possible to minimize the influence on the reception circuit 30, the transmission circuit 40, and the control circuit 50 due to such a current.

In the second embodiment, similar to the first embodiment, the high frequency wave current flows through the first closed circuit portion 23 in the direction opposite to that of the high frequency wave current flowing through the second closed circuit portion 24 at the same time. Accordingly, at a specific time, the high frequency magnetic field in the first closed circuit portion 23 flows the direction opposite to that of the high frequency magnetic field in the second closed circuit portion 24. As a result, the high frequency magnetic field generated with the high frequency wave current flowing in the first closed circuit portion 23 compensates the high frequency magnetic field generated with the high frequency wave current flowing in the second closed circuit portion 24.

Further, in the second embodiment, the high frequency wave current also flows in the third closed circuit portion 151 and the fourth closed circuit portion 152. Therefore, in order to reduce the strength of the high frequency magnetic field combined of each of the high frequency magnetic fields generated with each of the high frequency wave currents flowing in the first closed circuit portion 23, the second closed circuit portion 24, the third closed circuit portion 151, the fourth closed circuit portion 152, it is preferred to determine the wiring lengths and the widths of the first closed circuit portion 23, the second closed circuit portion 24, the third closed circuit portion 151, and the fourth closed circuit portion 152 in addition to the capacitances of the inner capacitor C1, the inner capacitor C2, the variable capacitance diode D1, the variable capacitance diode D2, the outer capacitor C3, the outer capacitor C4, the outer capacitor C5, the outer capacitor C6, and the outer capacitor C7.

In the second embodiment, the amplifier circuit 21 in the first embodiment may be disposed inside the semiconductor integrated circuit 160. When only the amplifier circuit 21 is disposed inside the semiconductor integrated circuit 160, it is possible to reduce a current consumption. However, it is difficult to reduce a fluctuation in the oscillation frequency. When only the amplifier circuit 121 is disposed outside the semiconductor integrated circuit 160, it is possible to reduce a fluctuation in the oscillation frequency. However, it is difficult to reduce a current consumption. Accordingly, the amplifier circuit 21 may be disposed inside the semiconductor integrated circuit 160 in addition to the amplifier circuit 121 disposed outside the semiconductor integrated circuit 160.

In this case, it is possible to use the amplifier circuit 21 disposed inside the semiconductor integrated circuit 160 to perform the oscillation operation when it is necessary to reduce the current consumption more than the fluctuation in the oscillation frequency. Further, it is possible to use the amplifier circuit 121 disposed outside the semiconductor integrated circuit 160 to perform the oscillation operation when it is necessary to reduce the fluctuation in the oscillation frequency more than the current consumption.

The disclosure of Japanese Patent Application No. 2010-235450, filed on Oct. 20, 2010, is incorporated in the application by reference.

While the invention has been explained with reference to the specific embodiments of the invention, the explanation is illustrative and the invention is limited only by the appended claims.

What is claimed is:
1. An oscillation circuit, comprising:
a resonance circuit including an inner capacitor to be disposed inside a semiconductor integrated circuit, and an outer capacitor and an outer inductor to be disposed outside the semiconductor integrated circuit;
an amplifier circuit including an input terminal and an output terminal both connected to the resonance circuit;

a first closed circuit portion including the inner capacitor, the outer inductor, and a first wiring portion for connecting the inner capacitor and the outer inductor; and a second closed circuit portion including the outer capacitor, the outer inductor, and a second wiring portion for connecting the outer capacitor and the outer inductor, said second closed circuit portion being configured to have a wiring resistance smaller than that of the first closed circuit portion.

2. The oscillation circuit according to claim 1, wherein said first closed circuit portion is configured to have a wiring length greater than that of the second closed circuit portion.

3. The oscillation circuit according to claim 1, wherein said first closed circuit portion is configured to have a cross sectional area smaller than that of the second closed circuit portion.

4. The oscillation circuit according to claim 1, wherein said outer capacitor is disposed outside an area surrounded with the first closed circuit portion.

5. The oscillation circuit according to claim 1, wherein said outer capacitor is configured to have a capacitance greater than that of the inner capacitor.

6. The oscillation circuit according to claim 1, wherein said amplifier circuit is to be disposed outside the semiconductor integrated circuit.

7. The oscillation circuit according to claim 1, further comprising a sub-amplifier circuit to be disposed inside the semiconductor integrated circuit, said sub-amplifier circuit including a sub-input terminal and a sub-output terminal both connected to the resonance circuit.

8. An oscillation circuit, comprising:
a resonance circuit including an inner capacitor to be disposed inside a semiconductor integrated circuit, and an outer capacitor and an outer inductor to be disposed outside the semiconductor integrated circuit; and
an amplifier circuit including an input terminal and an output terminal both connected to the resonance circuit,
wherein said resonance circuit includes a first closed circuit portion including the inner capacitor, the outer inductor, and a first wiring portion for connecting the inner capacitor and the outer inductor, and
said resonance circuit further includes a second closed circuit portion including the outer capacitor, the outer inductor, and a second wiring portion for connecting the outer capacitor and the outer inductor so that an electrical current flowing through the first closed circuit portion is smaller than that flowing through the second closed circuit portion when the oscillation circuit is operated.

9. The oscillation circuit according to claim 8, wherein said first closed circuit portion is arranged to surround a first region larger than a second region surrounded with the second closed circuit portion.

10. The oscillation circuit according to claim 9, wherein said outer capacitor is arranged outside the first region, said first region and said second region being arranged so that a first magnetic field generated according to an area of the first region and the electrical current flowing through the first closed circuit portion is cancelled out with a second magnetic field generated according to an area of the second region and the electrical current flowing through the second closed circuit portion.

11. The oscillation circuit according to claim 8, wherein said outer capacitor has a capacitance larger than that of the inner capacitor.

12. A wireless device, comprising:
a resonance circuit including an inner capacitor to be disposed inside a semiconductor integrated circuit, and an outer capacitor and an outer inductor to be disposed outside the semiconductor integrated circuit;
an amplifier circuit including an input terminal and an output terminal both connected to the resonance circuit; and
a reception circuit disposed inside the semiconductor integrated circuit,
wherein said resonance circuit includes a first closed circuit portion including the inner capacitor, the outer inductor, and a first wiring portion for connecting the inner capacitor and the outer inductor,
said resonance circuit further includes a second closed circuit portion including the outer capacitor, the outer inductor, and a second wiring portion for connecting the outer capacitor and the outer inductor, and
said second closed circuit portion is configured to have a wiring resistance smaller than that of the first closed circuit portion.

13. The oscillation circuit according to claim 1, wherein said resonance circuit further includes a variable capacitance diode connected to the inner capacitor so that a control voltage is applied to the inner capacitor through the variable capacitance diode.

* * * * *